(12) United States Patent
Zhang et al.

(10) Patent No.: US 9,965,901 B2
(45) Date of Patent: May 8, 2018

(54) GENERATING SIMULATED IMAGES FROM DESIGN INFORMATION

(71) Applicant: KLA-Tencor Corporation, Milpitas, CA (US)

(72) Inventors: Jing Zhang, Santa Clara, CA (US); Kris Bhaskar, San Jose, CA (US)

(73) Assignee: KLA—Tencor Corp., Milpitas, CA (US)

( * ) Notice: Subject to any disclaimer, the term of this patent is extended or adjusted under 35 U.S.C. 154(b) by 165 days.

(21) Appl. No.: 15/176,139

(22) Filed: Jun. 7, 2016

(65) Prior Publication Data

US 2017/0148226 A1 May 25, 2017

Related U.S. Application Data

(60) Provisional application No. 62/257,453, filed on Nov. 19, 2015.

(51) Int. Cl.
| | |
|---|---|
| *G06T 19/20* | (2011.01) |
| *G06T 9/00* | (2006.01) |
| *G06F 17/50* | (2006.01) |
| *G06K 9/62* | (2006.01) |
| *H04N 13/00* | (2018.01) |

(Continued)

(52) U.S. Cl.
CPC .......... *G06T 19/20* (2013.01); *G06F 17/5081* (2013.01); *G06K 9/4628* (2013.01); *G06K 9/6257* (2013.01); *G06T 7/00* (2013.01); *G06T 9/00* (2013.01); *H04N 13/0018* (2013.01); *G06T 2200/08* (2013.01)

(58) Field of Classification Search
CPC .............. G06T 19/20; G06T 9/00; G06T 7/00
See application file for complete search history.

(56) References Cited

U.S. PATENT DOCUMENTS

| | | | |
|---|---|---|---|
| 6,691,052 B1 * | 2/2004 | Maurer | G03F 1/84 702/81 |
| 7,570,796 B2 | 8/2009 | Zafar et al. | |
| 7,676,077 B2 | 3/2010 | Kulkarni et al. | |

(Continued)

FOREIGN PATENT DOCUMENTS

| | | |
|---|---|---|
| JP | 2005-338666 | 12/2005 |
| WO | 2006/019919 | 2/2006 |
| WO | 2011/096136 | 8/2011 |

OTHER PUBLICATIONS

International Search Report for PCT/US2016/062500 dated May 30, 2017.
Written Opinion for PCT/US2016/062500 dated May 30, 2017.
Bengio et al., "Greedy layer-wise training of deep networks," Advances in Neural Information Processing Systems 19 (NIPS'06), pp. 153-160, MIT Press, 2007.

(Continued)

*Primary Examiner* — Nam Pham
(74) *Attorney, Agent, or Firm* — Ann Marie Mewherter

(57) ABSTRACT

Methods and systems for generating simulated images from design information are provided. One system includes one or more computer subsystems and one or more components executed by the computer subsystem(s), which include a generative model. The generative model includes two or more encoder layers configured for determining features of design information for a specimen. The generative model also includes two or more decoder layers configured for generating one or more simulated images from the determined features. The simulated image(s) illustrate how the design information formed on the specimen appears in one or more actual images of the specimen generated by an imaging system.

43 Claims, 7 Drawing Sheets

(51) Int. Cl.
*G06K 9/46* (2006.01)
*G06T 7/00* (2017.01)

(56) References Cited

U.S. PATENT DOCUMENTS

| | | |
|---|---|---|
| 8,126,255 B2 | 2/2012 | Bhaskar et al. |
| 8,294,918 B2 | 10/2012 | Satoh et al. |
| 8,664,594 B1 | 4/2014 | Jiang et al. |
| 8,692,204 B2 | 4/2014 | Kojima et al. |
| 8,698,093 B1 | 4/2014 | Gubbens et al. |
| 8,716,662 B1 | 5/2014 | MacDonald et al. |
| 2011/0249885 A1 | 10/2011 | Murakawa et al. |
| 2014/0241610 A1 | 8/2014 | Duffy et al. |

OTHER PUBLICATIONS

Daumé III, "A Course in Machine Learning," 189 pages, 2012.
Kingma et al., "Auto-encoding variational bayes," arXiv:1312.6114v10, May 1, 2014, 14 pages.
Ranzato et al., "Generating more realistic images using gated MRF's," Advances in Neural Information Processing Systems 23 (NIPS'10), pp. 2002-2010, 2010.
Vincent et al., "Extracting and composing robust features with denoising autoencoders," Proceedings of the 25th international conference on Machine learning, pp. 1096-1103, Jul. 5-9, 2008, Helsinki, Finland.
Yang et al., "Object Contour Detection with a Fully Convolutional Encoder-Decoder Network," arXiv:1603.04530v1, Mar. 15, 2016, 10 pages.

\* cited by examiner

GENERATING SIMULATED IMAGES FROM DESIGN INFORMATION

BACKGROUND OF THE INVENTION

1. Field of the Invention

The present invention generally relates to methods and systems for generating simulated images from design information.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

As design rules shrink, the design that is formed on a specimen such as reticles and wafers, even when formed using an optimally performing process, can look much different from the actual design. For example, due to the inherent limitations of the physical processes involved in forming a design on a physical specimen, features in the design formed on the physical specimen typically have somewhat different characteristics than the design such as different shapes (e.g., due to corner rounding and other proximity effects) and can have somewhat different dimensions (e.g., due to proximity effects) even when the best possible version of the design has been formed on the specimen.

Sometimes, it is not possible to know how the design will appear on the specimen and in images of the specimen, on which the design information has been formed, generated by tools such as inspection tools, defect review tools, metrology tools and the like. However, it is often desirable to know how the design will appear on the specimen and in images generated by such tools for a number of reasons. One reason is to make sure that the design will be formed on the specimen in an acceptable manner. Another reason is to provide a reference for the design, which illustrates how the design is meant to be formed on the specimen, that can be used for one or more functions performed for the specimen. For example, in general, a reference is needed for defect detection so that any differences between the design formed on the specimen and the reference can be detected and identified as defects or potential defects.

Much work has therefore been done to develop various methods and systems that can simulate how the design will be formed on the specimen and will appear in images of the specimen. There are several currently used methods for generating such simulated images. For example, one currently used method is forward electromagnetic (EM) modeling. In this method, design information such as computer aided design (CAD) and material information for a specimen is used as input, and the method simulates the physical interaction between light and material and generates a near field or far field image. Another example of a currently used method is rule-based approximation. Given some practical constraints, this method handcrafts a collection of rules that approximate transformation from CAD to observed image.

There are, however, several disadvantages to the currently used methods for generating simulated images. For example, forward EM simulation is extremely computationally intensive, making it infeasible for use in real production, e.g., the simulated images cannot be generated fast enough using forward EM simulation for the production use case. This is true for mask inspection, wafer inspection, and wafer metrology applications. In addition, forward EM simulation cannot simulate CMP and etching effects captured by electron beam and optical images. In another example, rule-based approximation tends to result in a large collection of very complex rules, making it generally inapplicable and causing poor prediction in reality.

Accordingly, it would be advantageous to develop systems and methods for generating simulated images from design information that do not have one or more of the disadvantages described above.

SUMMARY OF THE INVENTION

The following description of various embodiments is not to be construed in any way as limiting the subject matter of the appended claims.

One embodiment relates to a system configured to generate simulated images from design information. The system includes one or more computer subsystems and one or more components executed by the one or more computer subsystems. The one or more components includes a generative model. The generative model includes two or more encoder layers configured for determining features of design information for a specimen. The generative model also includes two or more decoder layers configured for generating one or more simulated images from the determined features. The one or more simulated images illustrate how the design information formed on the specimen appears in one or more actual images of the specimen generated by an imaging system. The system may be further configured as described herein.

An additional embodiment relates to another system configured to generate images from design information. This system is configured as described above. This system also includes an imaging subsystem configured to generate the one or more actual images of the specimen. The computer subsystem(s) are, in this embodiment, configured to acquire the one or more actual images and the one or more simulated images and to perform one or more functions for the specimen based on the one or more actual images and the one or more simulated images.

Another embodiment relates to a computer-implemented method for generating simulated images from design information. The method includes determining features of design information for a specimen by inputting the design information to two or more encoder layers of a generative model. The method also includes generating one or more simulated images by inputting the determined features to two or more decoder layers of the generative model. The one or more simulated images illustrate how the design information formed on the specimen appears in one or more actual images of the specimen generated by an imaging system. The determining and generating steps are performed with one or more computer systems.

Each of the steps of the method described above may be further performed as described further herein. In addition, the embodiment of the method described above may include any other step(s) of any other method(s) described herein.

Furthermore, the method described above may be performed by any of the systems described herein.

Another embodiment relates to a non-transitory computer-readable medium storing program instructions executable on a computer system for performing a computer-implemented method for generating simulated images from design information. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
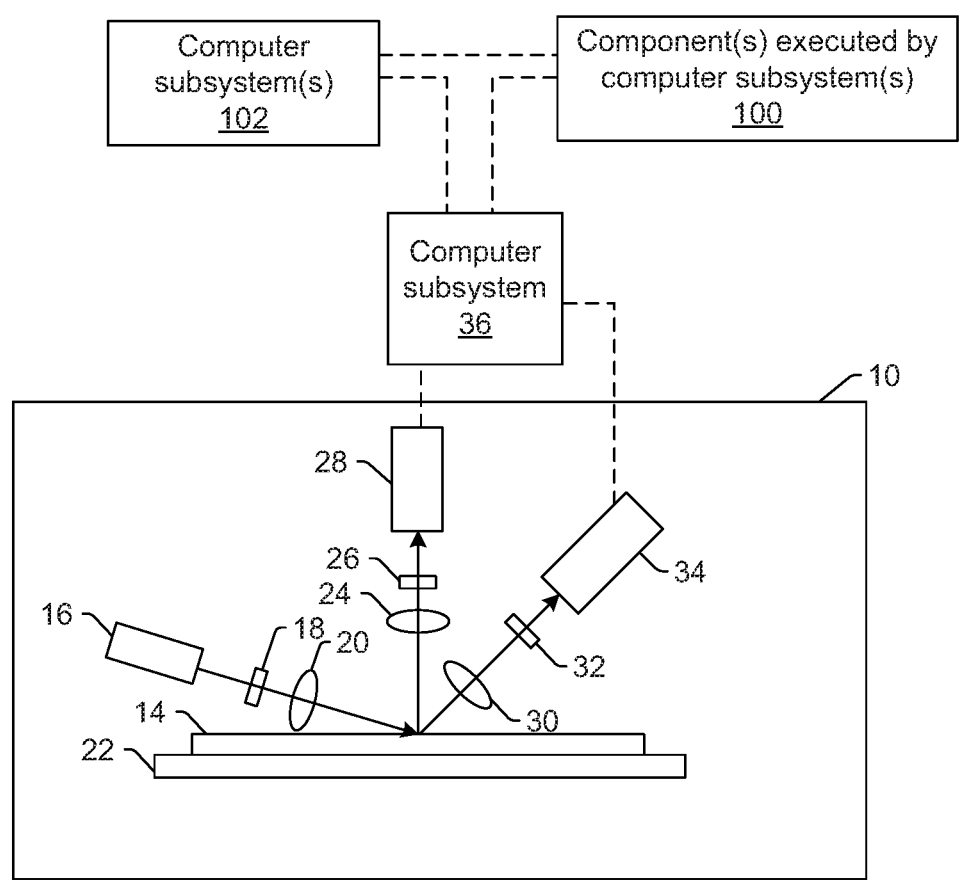
FIGS. 1 and 1a are schematic diagrams illustrating side views of embodiments of a system configured as described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design," "design data," and "design information" as used interchangeably herein generally refer to the physical design (layout) of an IC and data derived from the physical design through complex simulation or simple geometric and Boolean operations. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

In addition, the "design," "design data," and "design information" described herein refers to information and data that is generated by semiconductor device designers in a design process and is therefore available for use in the embodiments described herein well in advance of printing of the design on any physical specimens such as reticles and wafers.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

Some embodiments described herein include a deep generative model for realistic rendering of computer aided design (CAD) for applications such as semiconductor inspection and metrology. In addition, the embodiments described herein can provide a computationally efficient methodology for generating a realistic-looking image from associated CAD for tools such as electron beam and optical tools. For example, one embodiment relates to a system configured to generate simulated images from design information. The one or more simulated images illustrate how the design information formed on the specimen appears in one or more actual images of the specimen generated by an imaging system (or imaging subsystem).

One embodiment of such a system is shown in FIG. 1. The system includes one or more computer subsystems (e.g., computer subsystems 36 and 102) and one or more components 100 executed by the one or more computer subsystems. In some embodiments, the system includes imaging system (or subsystem) 10. In general, the imaging system is configured for scanning energy over a physical version of the specimen while detecting energy from the specimen to thereby generate the images for the specimen. The imaging system may also be configured to perform the scanning and the detecting with multiple modes.

In one embodiment, the specimen is a wafer. The wafer may include any wafer known in the art. In another embodiment, the specimen is a reticle. The reticle may include any reticle known in the art.

In one embodiment, the imaging system is an optical based imaging system. For example, the energy scanned over the specimen may include light, and the energy detected from the specimen may include light. In one such example, in the embodiment of the system shown in FIG. 1, imaging system 10 includes an illumination subsystem configured to direct light to specimen 14. The illumination subsystem includes at least one light source. For example, as shown in FIG. 1, the illumination subsystem includes light source 16. In one embodiment, the illumination subsystem is configured to direct the light to the specimen at one or more angles of incidence, which may include one or more oblique angles and/or one or more normal angles. For example, as shown in FIG. 1, light from light source 16 is directed through optical element 18 and then lens 20 to specimen 14 at an oblique angle of incidence. The oblique angle of incidence may include any suitable oblique angle of incidence, which may vary depending on, for instance, characteristics of the specimen.

The imaging subsystem may be configured to direct the light to the specimen at different angles of incidence at different times. For example, the imaging system may be configured to alter one or more characteristics of one or more elements of the illumination subsystem such that the light can be directed to the specimen at an angle of incidence that is different than that shown in FIG. 1. In one such example, the imaging system may be configured to move light source 16, optical element 18, and lens 20 such that the light is directed to the specimen at a different oblique angle of incidence or a normal (or near normal) angle of incidence.

In some instances, the imaging system may be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the specimen at different times. The illumination subsystem may have any other suitable configuration known in the art for directing the light having different or the same characteristics to the specimen at different or the same angles of incidence sequentially or simultaneously.

In one embodiment, light source 16 may include a broadband plasma (BBP) light source. In this manner, the light generated by the light source and directed to the specimen may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused onto specimen 14 by lens 20. Although lens 20 is shown in FIG. 1 as a single refractive optical element, it is to be understood that, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the imaging system may be configured to alter one or more of the elements of the illumination subsystem based on the type of illumination to be used for imaging.

The imaging system may also include a scanning subsystem configured to cause the light to be scanned over the specimen. For example, the imaging system may include stage 22 on which specimen 14 is disposed during inspection. The scanning subsystem may include any suitable mechanical and/or robotic assembly (that includes stage 22) that can be configured to move the specimen such that the light can be scanned over the specimen. In addition, or alternatively, the imaging system may be configured such that one or more optical elements of the imaging system perform some scanning of the light over the specimen. The light may be scanned over the specimen in any suitable fashion such as in a serpentine-like path or in a spiral path.

The imaging system further includes one or more detection channels. At least one of the one or more detection channels includes a detector configured to detect light from the specimen due to illumination of the specimen by the system and to generate output responsive to the detected light. For example, the imaging system shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, both detection channels are configured to detect scattered light, and the detection channels are configured to detect light that is scattered at different angles from the specimen. However, one or more of the detection channels may be configured to detect another type of light from the specimen (e.g., reflected light).

As further shown in FIG. 1, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 30, element 32, and detector 34 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 1 shows an embodiment of the imaging system that includes two detection channels, the imaging system may include a different number of detection channels (e.g., only one detection channel or two or more detection channels). In one such instance, the detection channel formed by collector 30, element 32, and detector 34 may form one side channel as described above, and the imaging system may include an additional detection channel (not shown) formed as another side channel that is positioned on the opposite side of the plane of incidence. Therefore, the imaging system may include the detection channel that includes collector 24, element 26, and detector 28 and that is centered in the plane of incidence and configured to collect and detect light at scattering angle(s) that are at or close to normal to the specimen surface. This detection channel may therefore be commonly referred to as a "top" channel, and the imaging system may also include two or more side channels configured as described above. As such, the imaging system may include at least three channels (i.e., one top channel and two side channels), and each of the at least three channels has its own collector, each of which is configured to collect light at different scattering angles than each of the other collectors.

As described further above, each of the detection channels included in the imaging system may be configured to detect scattered light. Therefore, the imaging system shown in FIG. 1 may be configured for dark field (DF) imaging of specimens. However, the imaging system may also or alternatively include detection channel(s) that are configured for bright field (BF) imaging of specimens. In other words, the imaging system may include at least one detection channel that is configured to detect light specularly reflected from the specimen. Therefore, the imaging systems described herein may be configured for only DF, only BF, or both DF and BF imaging. Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the imaging system may be signals or data, but not image signals or image data. In such instances, a computer subsystem such as computer subsystem 36 may be configured to generate images of the specimen from the non-imaging output of the detectors. However, in other instances, the detectors may be configured as imaging detectors that are configured to generate imaging signals or image data. Therefore, the imaging system may be configured to generate the images described herein in a number of ways.

It is noted that FIG. 1 is provided herein to generally illustrate a configuration of an imaging system or subsystem that may be included in the system embodiments described herein or that may generate images that are used by the system embodiments described herein. Obviously, the imaging system configuration described herein may be altered to optimize the performance of the imaging system as is normally performed when designing a commercial imaging system. In addition, the systems described herein may be implemented using an existing system (e.g., by adding functionality described herein to an existing system) such as the 29xx/28xx series of tools that are commercially available from KLA-Tencor, Milpitas, Calif. For some such systems, the embodiments described herein may be provided as optional functionality of the system (e.g., in addition to other functionality of the system). Alternatively, the imaging system described herein may be designed "from scratch" to provide a completely new imaging system.

Computer subsystem 36 of the imaging system may be coupled to the detectors of the imaging system in any suitable manner (e.g., via one or more transmission media, which may include "wired" and/or "wireless" transmission media) such that the computer subsystem can receive the output generated by the detectors during scanning of the specimen. Computer subsystem 36 may be configured to perform a number of functions described further herein using the output of the detectors.

The computer subsystems shown in FIG. 1 (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 36 may be coupled to computer subsystem(s) 102 as shown by the dashed line in FIG. 1 by any suitable transmission media, which may include any suitable wired and/or wireless transmission media known in the art. Two or more of such computer subsystems may also be effectively coupled by a shared computer-readable storage medium (not shown).

Although the imaging system is described above as being an optical or light-based imaging system, the imaging system may be an electron beam based imaging system. In one such embodiment, the energy scanned over the specimen includes electrons, and the energy detected from the specimen includes electrons. In one such embodiment shown in FIG. 1a, the imaging system includes electron column 122 coupled to computer subsystem 124.

Figure 1A:
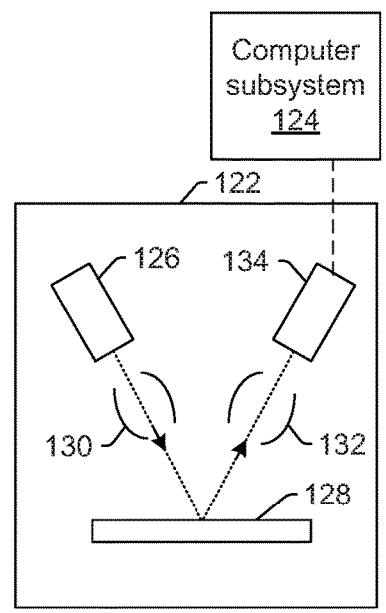

As also shown in FIG. 1a, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No.

8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 1a as being configured such that the electrons are directed to the specimen at an oblique angle of incidence and are scattered from the specimen at another oblique angle, it is to be understood that the electron beam may be directed to and scattered from the specimen at any suitable angles. In addition, the electron beam based imaging system may be configured to use multiple modes to generate images of the specimen as described further herein (e.g., with different illumination angles, collection angles, etc.). The multiple modes of the electron beam based imaging system may be different in any image generation parameters of the imaging system.

Computer subsystem 124 may be coupled to detector 134 as described above. The detector may detect electrons returned from the surface of the specimen thereby forming electron beam images of the specimen. The electron beam images may include any suitable electron beam images. Computer subsystem 124 may be configured to perform one or more functions described further herein for the specimen using output generated by detector 134. Computer subsystem 124 may be configured to perform any additional step(s) described herein. A system that includes the imaging system shown in FIG. 1a may be further configured as described herein.

It is noted that FIG. 1a is provided herein to generally illustrate a configuration of an electron beam based imaging system that may be included in the embodiments described herein. As with the optical imaging system described above, the electron beam based imaging system configuration described herein may be altered to optimize the performance of the imaging system as is normally performed when designing a commercial imaging system. In addition, the systems described herein may be implemented using an existing system (e.g., by adding functionality described herein to an existing system) such as the eSxxx and eDR-xxxx series of tools that are commercially available from KLA-Tencor. For some such systems, the embodiments described herein may be provided as optional functionality of the system (e.g., in addition to other functionality of the system). Alternatively, the system described herein may be designed "from scratch" to provide a completely new system.

Figure 2:
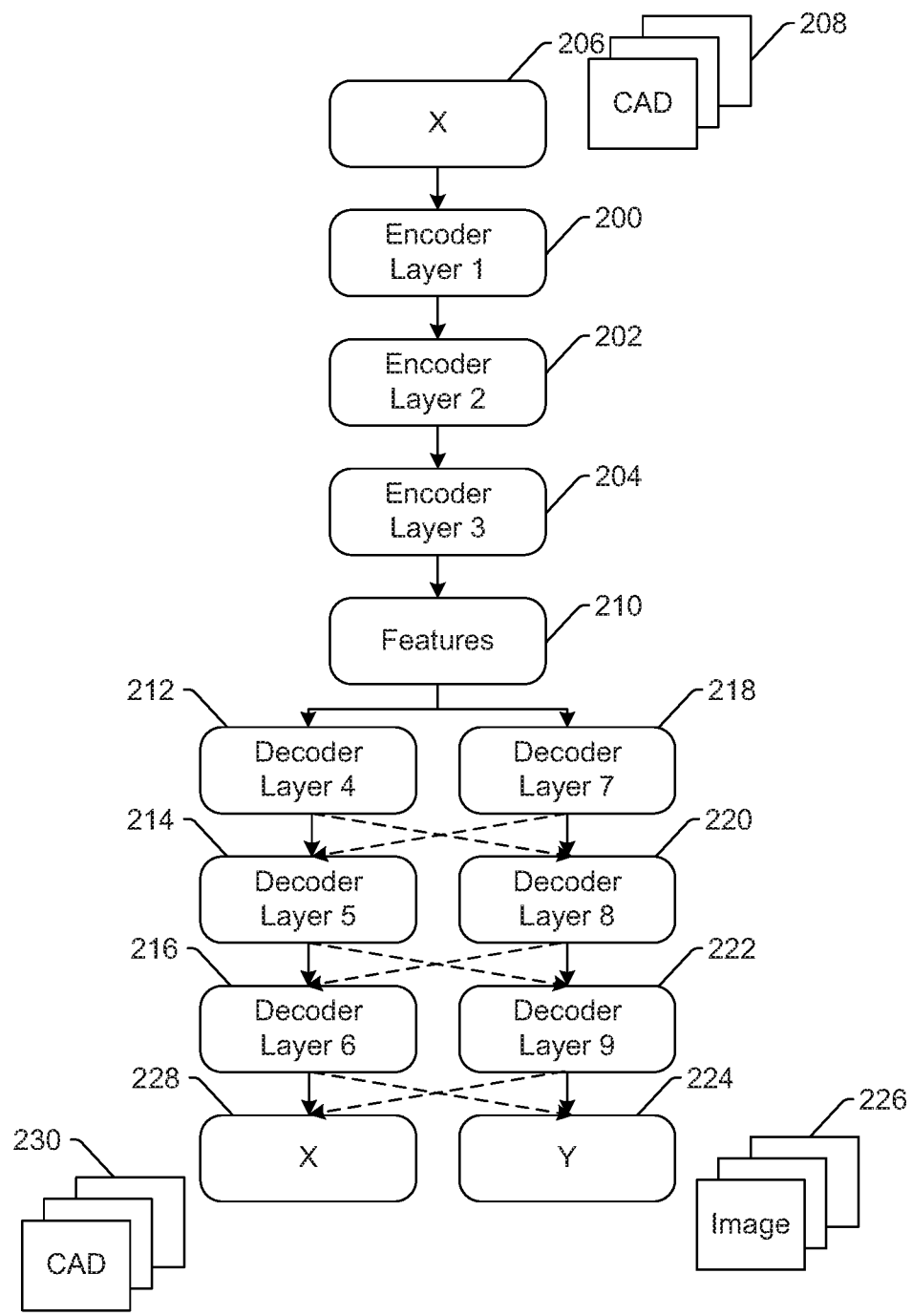
FIG. 2 is a schematic diagram illustrating one embodiment of a generative model that may be included in embodiments described herein.

Although the imaging subsystem is described above as being a light-based or electron beam-based imaging subsystem, the imaging subsystem may be an ion beam-based imaging subsystem. Such an imaging subsystem may be configured as shown in FIG. 2 except that the electron beam source may be replaced with any suitable ion beam source known in the art. In addition, the imaging subsystem may be any other suitable ion beam-based imaging subsystem such as those included in commercially available focused ion beam (FIB) systems, helium ion microscopy (HIM) systems, and secondary ion mass spectroscopy (SIMS) systems.

As noted above, the imaging system is configured for scanning energy over a physical version of the specimen thereby generating actual images for the physical version of the specimen. In this manner, the imaging system may be configured as an "actual" system, rather than a "virtual" system. For example, a storage medium (not shown) and computer subsystem(s) 102 shown in FIG. 1 may be configured as a "virtual" system. In particular, the storage medium and the computer subsystem(s) are not part of imaging system 10 and do not have any capability for handling the physical version of the specimen. In other words, in systems configured as virtual systems, the output of its one or more "detectors" may be output that was previously generated by one or more detectors of an actual system and that is stored in the virtual system, and during the "scanning," the virtual system may replay the stored output as though the specimen is being scanned. In this manner, scanning the specimen with a virtual system may appear to be the same as though a physical specimen is being scanned with an actual system, while, in reality, the "scanning" involves simply replaying output for the specimen in the same manner as the specimen may be scanned. Systems and methods configured as "virtual" inspection systems are described in commonly assigned U.S. Pat. No. 8,126,255 issued on Feb. 28, 2012 to Bhaskar et al. and U.S. Patent Application Publication No. 2014/0241610 by Duffy et al. published on Aug. 28, 2014, both of which are incorporated by reference as if fully set forth herein. The embodiments described herein may be further configured as described in this patent and patent application. For example, the one or more computer subsystems described herein may be further configured as described in this patent and patent application.

As further noted above, the imaging system may be configured to generate images of the specimen with multiple modes. In general, a "mode" can be defined by the values of parameters of the imaging system used for generating images of a specimen or the output used to generate images of the specimen. Therefore, modes that are different may be different in the values for at least one of the imaging parameters of the imaging system. For example, in one embodiment in which the energy scanned over the specimen and the energy detected from the specimen is light, at least one of the multiple modes uses at least one wavelength of the light for illumination that is different from at least one wavelength of the light for illumination used for at least one other of the multiple modes. The modes may be different in the illumination wavelength as described further herein (e.g., by using different light sources, different spectral filters, etc.) for different modes. In another embodiment, at least one of the multiple modes uses an illumination channel of the imaging system that is different from an illumination channel of the imaging system used for at least one other of the multiple modes. For example, as noted above, the imaging system may include more than one illumination channel. As such, different illumination channels may be used for different modes.

In one embodiment, the imaging system is an inspection system. For example, the optical and electron beam imaging systems described herein may be configured as inspection systems. In another embodiment, the imaging system is a defect review system. For example, the optical and electron beam imaging systems described herein may be configured as defect review systems. In a further embodiment, the imaging system is a metrology system. For example, the optical and electron beam imaging systems described herein may be configured as metrology systems. In particular, the embodiments of the imaging systems described herein and shown in FIGS. 1 and 1a may be modified in one or more parameters to provide different imaging capability depending on the application for which they will be used. In one such example, the imaging system shown in FIG. 1 may be configured to have a higher resolution if it is to be used for defect review or metrology rather than for inspection. In other words, the embodiments of the imaging system shown in FIGS. 1 and 1a describe some general and various configurations for an imaging system that can be tailored in a number of manners that will be obvious to one skilled in the art to produce imaging systems having different imaging capabilities that are more or less suitable for different applications.

The inspection system, defect review system, and metrology system may also be configured for inspection, defect review, and metrology of specimens such as wafers and reticles. For example, the embodiments described herein may be configured for using a deep generative model for realistic CAD rendering for both scanning electron microscopy (SEM) and optical images for the purposes of mask inspection, wafer inspection, and wafer metrology. In particular, the embodiments described herein may be installed on a computer node or computer cluster that is a component of or coupled to an imaging system such as a broadband plasma inspector, an electron beam inspector or defect review tool, a mask inspector, a virtual inspector, etc. In this manner, the embodiments described herein may generate simulated images that can be used for a variety of applications that include, but are not limited to, wafer inspection, mask inspection, electron beam inspection and review, metrology, etc. The characteristics of the imaging systems shown in FIGS. 1 and 1a can be modified as described above based on the specimen for which it will generate actual images.

The component(s), e.g., component(s) 100 shown in FIG. 1, executed by the computer subsystem(s), e.g., computer subsystems 36 and/or 102, include a generative model. A "generative" model can be generally defined as a model that is probabilistic in nature. In other words, a "generative" model is not one that performs forward simulation or rule-based approaches and, as such, a model of the physics of the processes involved in generating an actual image (for which a simulated image is being generated) is not necessary. Instead, as described further herein, the generative model can be learned (in that its parameters can be learned) based on a suitable training set of data. As described further herein, such generative models have a number of advantages for the embodiments described herein.

The generative model includes two or more encoder layers configured for determining features for design information for a specimen. One embodiment of a generative model is shown in FIG. 2. For example, as shown in FIG. 2, the generative model may include encoder layers 200, 202, and 204 (or encoder layers 1-3). The first encoder layer may receive input X, 206, which may be design information such as CAD images 208, or any of the other design information described herein. The encoder layers may be configured to determine features 210 from the design information. The features may include any suitable features known in the art that can be inferred from the input and used to generate the output described further herein. For example, the features may include a vector of intensity values per pixel. The features may also include any other types of features described herein, e.g., vectors of scalar values, vectors of independent distributions, joint distributions, or any other suitable feature types known in the art.

The generative model also includes two or more decoder layers configured for generating one or more simulated images from the determined features. For example, as shown in FIG. 2, the generative model may include decoder layers 212, 214, 216, 218, 220, and 222 (or decoder layers 4-6 and 7-9). The decoder layers may generate output Y, 224, which includes simulated images 226. The one or more simulated images illustrate how the design information formed on the specimen appears in one or more actual images of the specimen generated by an imaging system (or imaging subsystem). For example, the simulated images illustrate how the design information when formed on a specimen will appear in optical images, electron beam images, or other types of images generated by an optical imaging system, electron beam imaging system, or other type of imaging system described herein.

In one embodiment, the generative model is a deep generative model. For example, the generative model may be configured to have a deep learning architecture in that the generative model may include multiple layers, which perform a number of algorithms or transformations. The number of layers on one or both sides of the generative model may vary from that shown in the drawings described herein. For example, the number of layers on the encoder side of the generative model is use case dependent. In addition, the number of layers on the decoder side is use case dependent and may be dependent on the number of layers on the encoder side (which may be the case if, as described further herein, the decoder side is configured as a two pass decoder or if, as also described further herein, the two passes on the decoder side are combined as a single pass via channel dimension). In general, the number of layers on one or both sides of the generative model is not significant and is use case dependent. For practical purposes, a suitable range of layers on both sides is from 2 layers to a few tens of layers.

In a further embodiment, the two or more decoder layers are configured for regenerating the design information from the determined features. In this manner, the decoder both regenerates the design information and generates the one or more simulated images. For example, the encoder portion of the generative model infers the features given a representation X. The decoder portion of the generative model generates the joint probability of (X, Y) from the features. For example, as shown in FIG. 2, the decoder layers may generate output X, 228, that is regenerated design information, which in the embodiment shown in FIG. 2, is CAD images 230.

In one embodiment, the two or more decoder layers include first and second portions of the two or more decoder layers, and the first and second portions are jointly constructed. For example, the embodiments described herein can take advantage of deep learning concepts such as joint construction to solve the normally intractable representation conversion problem (e.g., rendering). In one such example, the two passes (layers 4-6 configured in one pass and layers 7-9 configured in another pass) at the decoder side may be constructed jointly, as shown by the dashed lines in FIG. 2. In particular, layers 4 and 7 may each generate their own output that is a function of features 210. Therefore, layers 4 and 7 may receive only one input (i.e., the features) and generate only one output per layer. However, other layers on the decoder side may receive multiple inputs and generate only a single output. For example, the inputs to both of layers 5 and 8 may be the outputs of both of layers 4 and 7. Layers 5 and 8 may perform different functions on the outputs of layers 4 and 7. In this manner, the outputs of layers 5 and 8 will not be the same. In addition, the inputs to both of layers 6 and 9 may be the outputs of both of layers 5 and 8. Layers 6 and 9 may perform different functions on the outputs of layers 6 and 9. In this manner, the outputs of layers 6 and 9 will also not be the same as each other.

Layers 4-6 and 7-9 may be, therefore, data dependent. In particular, in some of the embodiments described herein, the output of layer 8 depends on the results from layers 4 and 7 while the output of layer 9 depends on the results from layers 4, 5, 7, and 8. In a similar manner, in some of the embodiments described herein, the output of layer 5 depends on the results from layers 4 and 7 while the output of layer 6 depends on the results from layers 4, 5, 7, and 8.

In this manner, the outputs of layers 6 and 9 will not be the same. For example, the output of layer 9 may be Y, as shown in FIG. 2, which may be the simulated images described further herein. In addition, the output of layer 6 may be X, as shown in FIG. 2, which may be the regenerated design information, e.g., the regenerated CAD images. However, the outputs of layers 6 and 9 may be combined in some manner to generate the outputs X and Y. For example, the outputs of layers 6 and 9 may be combined to generate Y, which is the simulated images described further herein. The outputs of layers 6 and 9 may also be combined to generate X, which is the regenerated design information.

In this manner, some of the embodiments described herein break the symmetry of the encoder and decoder in the generative model such that the decoder portion can generate a joint representation of the original input (e.g., the regenerated design information and the simulated images). In other words, if the encoder and decoder are symmetrical, the encoder would generate the features from the design information while the decoder would generate the design information from the features. In this manner, the functionality of the encoder and decoder are symmetric; starting from X and ending at X. Breaking the symmetry in this case means to configure the decoder to predict (render) something other than X. In the embodiments described herein, the decoder is configured to predict (render) both X and Y from the features f. In addition, breaking the symmetry of the encoder and decoder may be implemented by not constraining the layers and layer types of the decoder by those of the encoder.

In another embodiment, the generative model is a convolution and deconvolution neural network. For example, the embodiments described herein can take advantage of deep learning concepts such as a convolution and deconvolution neural network to solve the normally intractable representation conversion problem (e.g., rendering). The generative model may have any convolution and deconvolution neural network configuration or architecture known in the art.

In some embodiments, the two or more encoder layers include two or more convolutional and pooling layers, and the two or more decoder layers include two or more deconvolutional and up-pooling layers. For example, in the embodiment shown in FIG. 2, encoder layers 1-3 may be configured as convolution and pooling layers while decoder layers 4-9 may be deconvolutional layers. The decoder layers may also include up-pooling layers. Other layer types on the encoder and decoder sides are also possible, however. For example, the possible layer types for the encoder and decoder sides include, but are not limited to, convolution layers, deconvolutional layers, fully-connected layers, local response normalization layers, pooling layers, up-pooling layers, etc. The layer types included in the encoder and decoder layers may have any suitable configuration known in the art.

In one embodiment, the two or more encoder layers determine the features by dimension reduction of the design information. For example, the embodiments described herein can take advantage of deep learning concepts such as dimension reduction to solve the normally intractable representation conversion problem (e.g., rendering). In particular, dimension reduction is performed by the encoder portion of the generative model by reducing the input image (e.g., CAD) to lower dimension features. In addition, the encoder layers may perform the functions described herein by (a) compressing the information content and/or (b) extracting features, which may be performed in any suitable manner known in the art. The multiple layers of the encoder may also determine hierarchical local features similar to what a convolutional neural network (CNN) does. The multiple layers of the decoder may reconstruct the hierarchical features given the feature values in the feature layer.

In some embodiments, the design information is CAD data. Although some embodiments may be described herein with respect to CAD or CAD data or images, it is to be understood that the embodiments described herein may use any other design information described herein.

Figure 3:
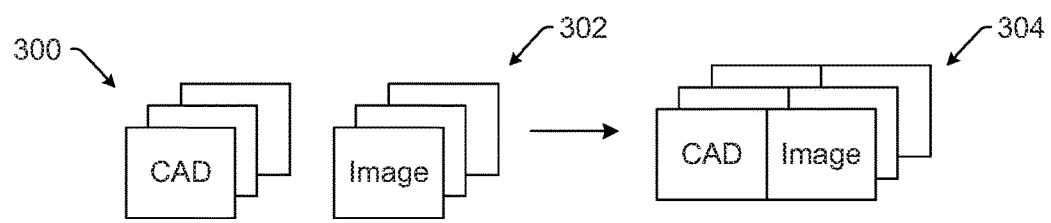
FIG. 3 is a schematic diagram illustrating one embodiment of a training dataset that may be generated by embodiments described herein.

In one embodiment, the computer subsystem(s) are configured for generating a training dataset used for training the generative model, and the training dataset includes a set of pairs of a portion of other design information and an actual image generated for the portion of the other design information. The other design information may include any of the design information described herein. The computer subsystem(s) may, therefore, prepare a training dataset. In this step, a training dataset may be generated by alignment and image cropping of CAD and real images, resulting in a collection of pairs of aligned CAD and real image (e.g., SEM or optical image), wherein "real" images are those that are generated by imaging a physical specimen on which the design information has been formed. In particular, as shown in FIG. 3, different portions 300 of CAD and their corresponding actual images 302 may be aligned and cropped to produce pairs 304 of corresponding CAD portions and actual images.

The CAD may be rendered as a binary image and uneven pixel size may be restored before alignment. The pixel size may be "uneven" due to image distortion from hardware. For example, in an electron beam image, due to the instability of the electron beam, a pixel at a first location on a specimen could represent a 10 nm by 10 nm area on the specimen while another pixel at a second location on the specimen (which may be relatively close to the first location) may represent a 11 nm by 11 nm area on the specimen, while the expected pixel size is 10.5 nm by 10.5 nm.

The portions of the design information and the actual images may have any suitable size and may vary depending on the characteristics of the process(es) used to form the design information on the specimen and/or the process(es) used to generate actual images of the design information formed on the specimen. For example, in order for the actual images to contain useful information for training, a lower limit on the useful size of the actual images may be determined based on the optical scattering effects involved in generating the actual images (e.g., due to the point spread function (PSF) of a lithography tool and/or an optical imaging tool in the case of optical real images). In some examples, the size of the actual images may be on the order of an image frame (e.g., thousands of pixels) to the order of a patch image (e.g., tens of pixels). The number of pairs of design information portions and actual images included in the training dataset may be any suitable number and may vary depending on the use case.

In another embodiment, the computer subsystem(s) are configured for modifying a portion of other design information to create a predetermined defect in the portion of the other design information and generating a training dataset used for training the generative model, and the training dataset includes: a pair of the modified portion of the other design information and an actual image generated for the modified portion of the other design information; and other pairs of a portion of the other design information and an actual image generated for the portion of the other design information. For example, the embodiments described herein may be configured for synthetic defect simulation (or "generating synthetic defects"). In one such example, synthetic defects can be injected into the training dataset for SEM and optical systems by modifying the CAD to inject defects (e.g., protrusions) and then rendering it using the network and adding it as a training example. The design information may be modified in any suitable manner to create synthetic defects in the design information. If actual images have not been generated for the modified design information portion, then a simulated image (which may be generated as described herein using a generative model) may be used as its actual image in the training dataset. Any one design information portion may be modified in a number of different ways to generate different synthetic defects therein. In addition, different portions of the design information may be modified in the same or different ways to create the same or different synthetic defects in each of the different portions of the design information. Furthermore, as noted above, the modified design information and image pairs may be combined with non-modified design information and image pairs to create the training dataset. The images included in the pairs in the training dataset are preferably actual (or non-simulated images) unless those actual images are not available. The other design information used in this embodiment may include any of the design information described herein.

In some embodiments, the one or more computer subsystems are configured for pre-training the two or more encoder layers and a portion of the two or more decoder layers. For example, the computer subsystem(s) may be configured for optional unsupervised pre-training. The purpose of the pre-training step may be to learn a compact representation (i.e., features) for the CAD. The pre-training described herein may involve all of the layers on the encoder side but may not involve all of the layers on the decoder side of the generative model. For example, the pre-training may involve layers 4-6 on the decoder side but not layers 7-9 on the decoder side. In particular, the optional pre-training does not need to produce exact results. Instead, it can produce approximate parameters for the layers, which can then be modified or adjusted during actual training. Therefore, by ignoring the data dependency between layers 4-6 and 7-9, the pre-training can produce approximate parameters for layers 4-6, which can simplify training that is subsequently performed for all of the layers of the generative model. The pre-training performed in such embodiments may be performed as described further herein.

Figure 4:
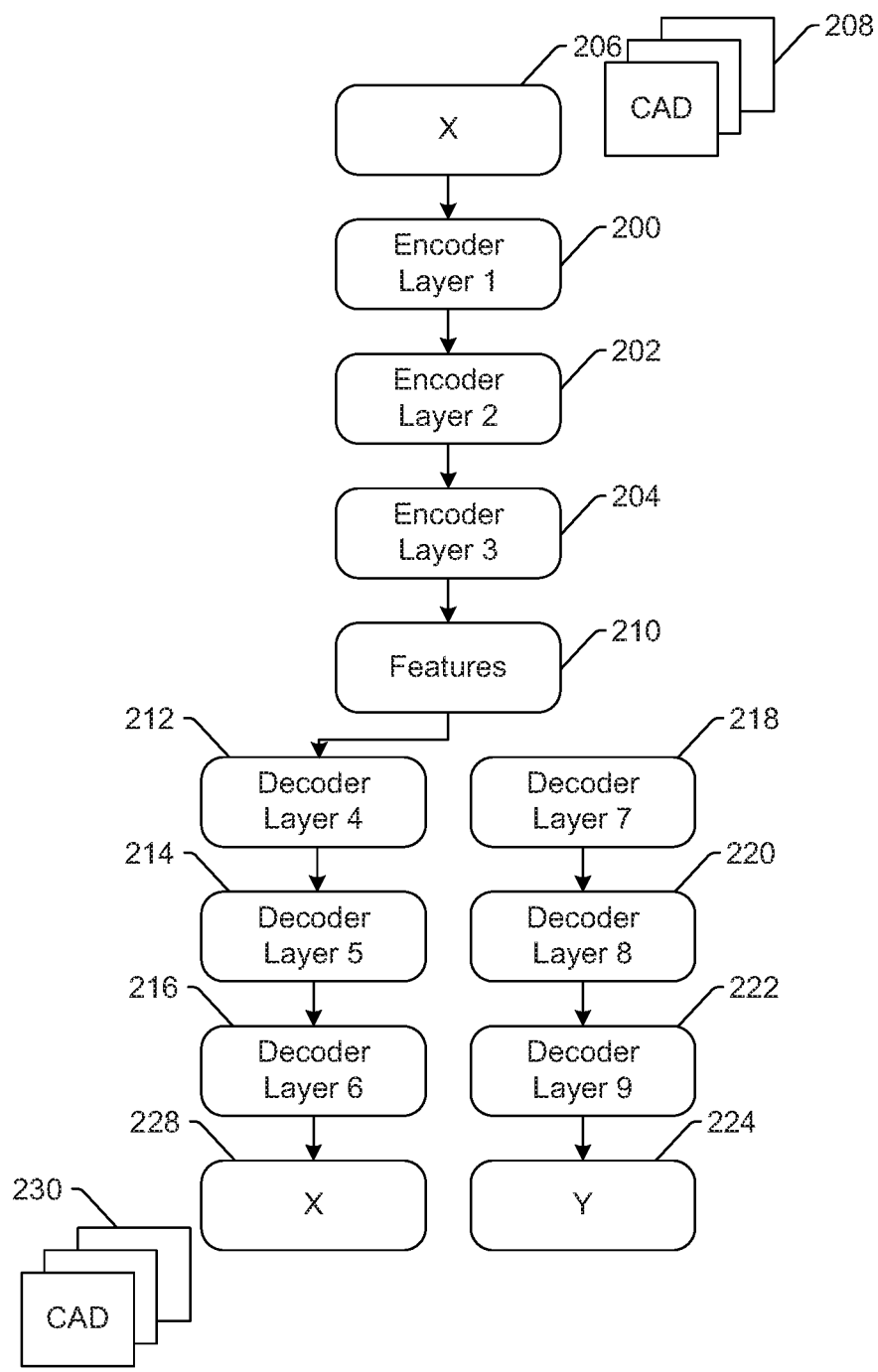
FIG. 4 is a schematic diagram illustrating an embodiment of a generative model in a pre-training phase that may be performed by embodiments described herein.

In another embodiment, the computer subsystem(s) are configured for training the two or more encoder layers and a portion of the two or more decoder layers by learning the features for design information in a training dataset, and the learning includes inferring the features for the design information in the training dataset using the two or more encoder layers and regenerating the design information in the training dataset from the inferred features using the portion of the two or more decoder layers. For example, in the pre-training step, a generative network may be trained to infer and to regenerate the input CAD, as shown in FIG. 4. The top half (above the feature layer) along with the bottom left half (below the feature layer), i.e., layers 1-6, are trained, e.g., using an additional component such as an auto-encoder or its variants. In particular, during pre-training, encoder layer 1 (200) may receive input X, 206, which is shown in this embodiment to be CAD images 208. Encoder layers 1-3 (200, 202, and 204) generate features 210 from the input. The features are input to decoder layer 4 (212). Decoder layers 4-6 (212, 214, and 216) regenerate output X, 228, which in this embodiment is CAD images 230. In this manner, the encoder layers can generate features from the design information that can then be used by the decoder layers to regenerate the design information. Based on differences between the input design information and the regenerated design information, one or more parameters of the encoder layers and/or the decoder layers can be modified until the input design information substantially matches the regenerated design information. As such, the pre-training may produce one or more parameters for one or more of layers 1-6. The one or more parameters may include any of the parameters described herein such as weights.

The pre-training is optional in that it can be followed by a training phase during which the one or more parameters are further modified by training performed during the training phase. However, the pre-training phase may advantageously reduce the time and effort that is involved in the training phase since the one or more parameters of the encoder layers and the portion of the decoder layers involved in the pre-training may not need substantial modifications after pre-training.

As shown in FIG. 4, although decoder layers 7-9 may be included in the generative model prior to pre-training, decoder layers 7-9 are not involved in the pre-training. In this manner, decoder layers 7-9 do not generate output Y, 224, during pre-training and do not contribute to generating output X, 228, during pre-training (as indicated by decoder layers 7-9 being shown not connected to layers 4-6 and features 210 in FIG. 4).

In one such embodiment, the training is unsupervised. For example, the embodiments described herein can take advantage of deep learning concepts such as unsupervised learning to solve the normally intractable representation conversion problem (e.g., rendering). In particular, as shown in FIG. 4, the top half (above the feature layer) along with the bottom left half (below the feature layer), i.e., layers 1-6, are trained in an unsupervised manner (i.e., without any labeling), e.g., using an additional component such as an auto-encoder or its variants. In particular, this training is unsupervised in the sense that no expected features or expected values for features are provided for the training.

In another such embodiment, the one or more components include an additional component, and the training is performed using the additional component. In such embodiments, the additional component includes an auto-encoder, a stacked auto-encoder, an auto-encoder with regularization (any regularization including L0, L1, L2, L_infinity), a denoising auto-encoder, stacked denoising auto-encoders, a sparse auto-encoder, a variational auto-encoder, an auto-encoder configured to learn a distribution of features (any of the distributions described further herein), a Restricted Boltzmann Machine (RBM), a RBM configured to learn a distribution of features (especially for Bernoulli RBM and mean-covariance RBM and the possible distributions include any of the distributions described further herein), a gated Markov Random Field (a gated MRF), a Deep Boltzmann Machine, a Deep Belief Network, a convolutional RBM, a convolution auto-encoder, a convolutional neural network, a recurrent neural network (RNN), a long short-term memory, generative adversarial nets, or some combination thereof. For example, the embodiments described herein can take advantage of deep learning concepts such as a variational auto-encoder to solve the normally intractable representation conversion problem (e.g., rendering). A variational auto-encoder is a component that takes the merits of deep learning and variational inference and leads to significant advances in generative modeling. Examples of stacked auto-encoders that may be used in the embodiments described herein are described by Bengio et al., "Greedy layer-wise training of deep networks," Advances in Neural Information Processing Systems 19 (NIPS'06), pp. 153-160, MIT Press, 2007, which is incorporated by reference as if fully set forth herein. Examples of stacked denoising auto-encoders that may be used in the embodiments described herein are described by Vincent et al., "Extracting and composing robust features with denoising autoencoders," Proceedings of the 25th international conference on Machine learning, pp. 1096-1103, Jul. 5-9, 2008, Helsinki, Finland, which is incorporated by reference as if fully set forth herein. Examples of gated MRFs that may be used in the embodiments described herein are described by Ranzato et al., "Generating more realistic images using gated MRF's," Advances in Neural Information Processing Systems 23 (NIPS'10), pp. 2002-2010, 2010, which is incorporated by reference as if fully set forth herein. The additional component in all of its variants used for training or pre-training may have any suitable configuration known in the art.

In any of the embodiments described herein in which features are inferred or learned, the features may include vectors of scalar values, vectors of independent distributions, or joint distributions. In some embodiments, the learned features include vectors of independent distributions, and the vectors of independent distributions include Bernoulli, binomial, multinomial, Poisson binomial, beta-binomial, multinomial, Boltzmann, Poisson, Conway-Maxwell-Poisson, Beta, Gaussian/Normal, Skew normal, Rayleigh, Laplace, gamma, pareto, or student-t distributions. In another embodiment, the learned features include joint distributions, and the joint distributions include Multivariate Gaussian/Normal, multivariate student-t, Dirichlet, matrix Gaussian/normal, or matrix t-distributions. The features may, however, include any other suitable types of features known in the art. The different types of features may be learned or inferred in any suitable manner known in the art.

In one embodiment, the computer subsystem(s) are configured for pre-training the two or more encoder layers and a portion of the two or more decoder layers and, subsequent to the pre-training, training the two or more encoder layers, the portion of the two or more decoder layers, and another portion of the two or more decoder layers. In another embodiment, the two or more decoder layers include first and second portions of the two or more decoder layers, and the one or more computer subsystems are configured to jointly train the first and second portions. For example, the computer subsystem(s) may be configured for transfer learning and joint training. In one such example, after the pre-training, the learned weights for layers 1-6 may be transferred and used to train layers 7-9 in a joint training network, as shown in FIG. 2. In this manner, the joint training may be performed using the additional component (to train layers 1-3 and 4-6) and regression (to train layers 1-3 and 7-9) to learn the joint probability of X and Y for features f. The generative network is trained to infer and generate design information and simulated images simultaneously given a rendered CAD. In this manner, layers 4-6 and layers 7-9 can be trained together.

In other words, layers 4-6 depend on layers 1-3, and layers 7-9 also depend on layers 1-3. If layers 1-3 are trained along with layers 7-9, then pre-trained layers 4-6 are preferably updated. In particular, since the training of layers 7-9 depends on the parameters of layers 4-6, layers 4-6 and 7-9 are preferably trained together. In addition, as described further herein, the two passes on the decoder side, layers 4-6 and layers 7-9, may be jointly constructed. Therefore, layers 4-6 are preferably trained again (in addition to pre-training) due to data dependence with layers 7-9. Similarly, if the one pass implementation via channel dimension described further herein is used, layers 4-6 are preferably trained again (in addition to pre-training) due to data dependence with layers 7-9. In this manner, the pre-training involving layers 4-6 may be to pre-train layers 1-3 in order to produce a "good" encoder (i.e., feature extractor) for features. The subsequent training involving layers 4-6 is the joint training with layers 7-9. This second training is to learn a decoder that predicts the representations X and Y and also to fine tune the pre-trained encoder.

Pre-training may be performed on a training dataset for several epochs (where one epoch involves running through the training dataset once). Joint training may also be performed on a training dataset for several epochs. In terms of the training dataset, pre-training and joint training use the same training dataset.

In some embodiments, the one or more computer subsystems are configured for training the two or more encoder layers and the two or more decoder layers by learning the features for design information in a training dataset, and the learning includes inferring the features for the design information in the training dataset using the two or more encoder layers, regenerating the design information in the training dataset from the inferred features using the two or more decoder layers, generating simulated images for the design information in the training dataset from the inferred features using the two or more decoder layers, and modifying one or more parameters of the two or more decoder layers until the simulated images for the design information in the training dataset match actual images for the design information in the training dataset. In this manner, the computer subsystem(s) may be configured for transfer learning. Inferring the features for the design information in the training dataset and regenerating the design information in the training dataset from the inferred features may be performed as described further herein. For example, layers 1-6 may be used to infer the features and to regenerate the design information until the regenerated design information matches the original design information.

This step may be performed in a pre-training step. This may also or alternatively be performed in the training step. For example, if the computer subsystem(s) perform the pre-training as described herein, then the features may be inferred and the design information may be regenerated from the inferred features again during training while the additional decoder layers are being trained. Instead, if the computer subsystem(s) are not configured for pre-training of layers 1-6, then training may include training layers 1-6 while layers 7-9 are also being trained. In other words, regardless of whether pre-training is performed, the training of the generative model may include training or re-training layers 1-6.

While the features are being inferred from the design information and the design information is being regenerated from the inferred features, the simulated images may be generated as described herein from the inferred features. The simulated images may be compared to the actual images, and any differences between the simulated images and the actual images may be determined and used to modify one or more parameters of the decoder layers. In this manner, the generation of the simulated images, the comparisons of the simulated images and the actual images, and modification of the parameters of the generative model may be iteratively performed until the simulated images match the actual images. The parameters of the generative model that are modified in this embodiment may include any of the parameters described herein.

In some such embodiments, the training is supervised. For example, the embodiments described herein can take advantage of deep learning concepts such as supervised learning to solve the normally intractable representation conversion problem (e.g., rendering). In particular, the regression performed for training layers 1-3 and 7-9 may be supervised regression because the answer (e.g., actual images such as SEM images that the simulated images are meant to be substantially similar to) are provided.

In additional such embodiments, the one or more parameters include weights. For example, the one or more parameters of the generative model that are modified by the embodiments described herein may include one or more weights for any layer of the generative model that has trainable weights. In one such example, the weights may include weights for the convolution layers but not pooling layers.

In one embodiment, the two or more encoder layers are fixed. In another embodiment, the two or more encoder layers are trainable. For example, layers 1-3 may be fixed or trainable (depending on the use case).

The learned weights in the joint training network represent the learned model, which can then be installed on a target system, e.g., one of the imaging systems described herein. At system runtime, a rendered CAD or other design information described herein is provided and processed by layers 1-3 and 7-9 in the learned model to generate a simulated image, as shown in FIG. 2. In this manner, the joint training described herein is a new technique to solve the feature inference (i.e., via unsupervised training) and regression (i.e., via supervised training) simultaneously, which makes this representation conversion problem solvable in practice.

In one embodiment, the two or more decoder layers include a first portion of the two or more decoder layers configured in a first pass and a second portion of the two or more decoder layers configured in a second pass. In one such example, the two passes (layers 4-6 and layers 7-9) at the decoder side may be constructed jointly, as shown by the dashed lines in FIG. 2. In this manner, the embodiment of FIG. 2 shows a jointed two-pass implementation. The two-pass configuration may have any suitable architecture known in the art. As described herein, the different portions of the decoder layers are data dependent, therefore, although the decoder portion of the generative model may be configured as a two-pass decoder, the two passes are actually performed at the same time (i.e., one pass is not performed followed by performance of another pass).

Figure 5:
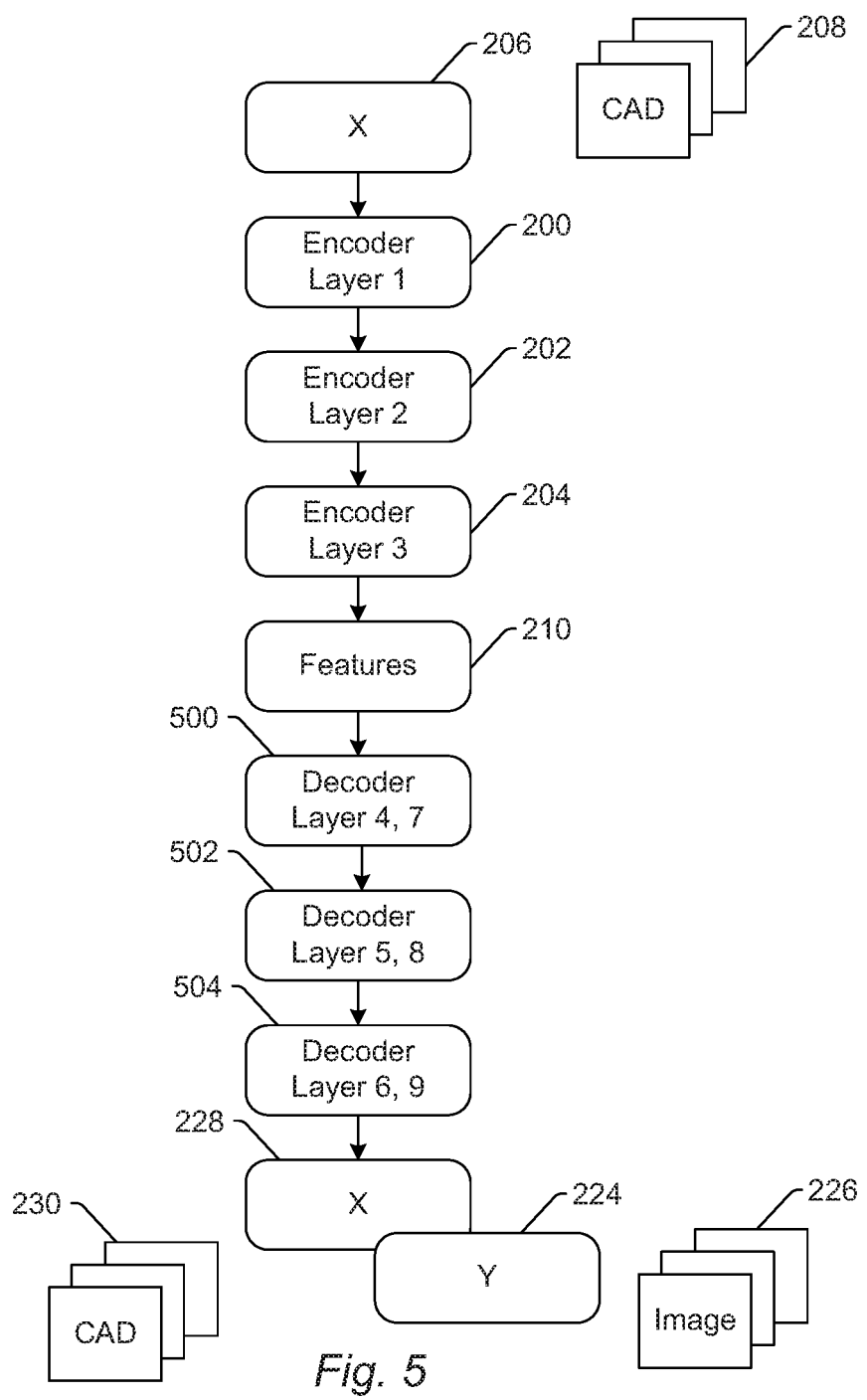
FIGS. 5-6 are schematic diagrams illustrating embodiments of a generative model that may be included in embodiments described herein.

In another embodiment, the two or more decoder layers include first and second portions of the two or more decoder layers configured as a single pass via channel configuration. For example, the jointed two passes at the decoder side can be implemented as a single pass via channel dimension of weights, as shown in FIG. 5. In other words, the jointed two-pass decoder can be equivalently implemented as a one-pass decoder via channel dimension in weights, and the resulting X and Y are folded in different channels. In this manner, the channel folding is mathematically identical to the two pass configuration described herein because, in one example of layers 5 and 8, layers 5 and 8 may be combined together as a single layer by folding their inputs (and outputs) together into the input (and output) channel dimension of the deconvolutional layer. In this case, the pre-training weights generated by the optional pre-training may be transferred to the corresponding channels. In this manner, FIG. 5 shows an alternative one pass implementation via channel dimension.

In particular, as shown in FIG. 5, the encoder side of the generative model may be configured as described herein. However, the decoder side of the generative model shown in FIG. 5 may be different from other embodiments of the generative model described herein. For example, as shown by decoder layer 500, decoder layers 4 and 7 may be combined together as a single layer that performs the same functions as layers 4 and 7 described further herein. In addition, decoder layers 5 and 8 may be combined together as a single layer, decoder layer 502, that performs the same functions as layers 5 and 8 described further herein. Furthermore, decoder layers 6 and 9 may be combined as a single layer, decoder layer 504, that performs the same functions as layers 6 and 9 described further herein. In this manner, the output of the final decoder layer included in the embodiment shown in FIG. 5, e.g., decoder layer 504, may include both output X, 228, which in this instance is shown to be CAD images 230, and output Y, 224, which in this instance is shown as simulated images 226.

The embodiment shown in FIG. 5 may be configured to generate the outputs X and Y as described further herein. The computer subsystem(s) may be configured to train (and optionally pre-train) the embodiment of the generative model shown in FIG. 5 as described further herein.

In an additional embodiment, the one or more actual images are generated for the specimen by the imaging system after a process is performed on the specimen, and the process includes a final fabrication process step that is not a lithography process. For example, the embodiments described herein are capable of diverse learning. In one such example, the embodiments described herein are capable of learning a complex and diverse implicit model that regenerates major post-lithography effects that may be shown in a real image. In this manner, the embodiments described herein may be configured for using a deep generative model for learning post-lithography features. In particular, the embodiments described herein can be used to simulate the variations that may be present in the patterned features on the specimen (and therefore in images of the patterned features) that are due to post-lithography processes such as etch and chemical-mechanical polishing (CMP), which cannot be simulated by models that are capable of only simulating the optical processes involved in printing the patterned features on the specimen and/or the processes (optical or otherwise) involved in generating images of the patterned features on the specimen. In this manner, the embodiments described herein can be configured for simulating the systematic process distortion of the patterned features (and therefore images of the patterned features) caused in etching and CMP steps.

Having the capability to generate simulated images that are equivalent to actual images of a specimen that would be generated by an imaging system after a non-lithography process step such as etch and CMP is performed on the specimen is important since these processes can have a significant effect on the patterned features formed on the specimen. As such, generating actual images of the patterned features after such processes for purposes such as inspection, defect review, metrology, etc. is performed fairly frequently. Therefore, having simulated images such as those described herein that can be used with the actual images generated after such processes is particularly important for uses such as those described further herein, e.g., inspection, alignment, calibration, defect review, metrology, etc.

The generative model described herein may be generated for specific specimens (e.g., specific wafers or reticles), processes, and imaging parameters. In other words, the generative models described herein may be specimen specific, process specific, and imaging parameter specific. In this manner, different generative models may be generated for different wafer layers. In addition, different generative models would have to be generated for different sets of imaging parameters (e.g., different imaging modes). Each of the different models may be generated with different training sets of data. Each of the different training sets of data may be generated as described further herein.

In one embodiment, at least one of the one or more simulated images illustrates one or more statistics for the one or more simulated images. In particular, the one or more simulated images may be image(s) in which different gray levels correspond to different values of a statistic (e.g., mean or standard deviation) for a characteristic (e.g., intensity) of each pixel in the simulated image(s). For example, the embodiments described herein may be configured for substantially realistic rendering from statistics. In particular, the learned implicit model represents the statistics of the training dataset and is capable of generating/predicting important statistics (e.g., mean (average estimate for each pixel) and standard deviation of grey level (variance or confidence spread at each pixel)). Therefore, the embodiments described herein can generate pixel values for the simulated images as well as the distribution and uncertainty of the pixel values. In this manner, the embodiments described herein are different from other methods and systems for generating simulated images such as those described herein because the generative model included in or used by the embodiments can generate not just predictions but also confidence of those predictions.

The one or more statistics may include one or more distributions selected from a group consisting of Bernoulli, binomial, multinomial, Poisson binomial, beta-binomial, beta-multinomial, Boltzmann, Poisson, Conway-Maxwell-Poisson, Beta, Gaussian/Normal, Skew normal, Rayleigh, Laplace, gamma, pareto, student-t, multivariate Gaussian/Normal, multivariate student-t, Dirichlet, matrix Gaussian/Normal, and matrix t-distribution. In addition, the statistics are not limited to these statistics examples and may include any other suitable statistics known in the art. Such statistics and distributions may be calculated in any suitable manner known in the art.

In another embodiment, generating the one or more simulated images includes directly deriving the one or more simulated images from the determined features. For example, as a special case, if Y are features directly derived from X (e.g., edges, contour, segmentation boundary, etc.), Y can be defined as "feature of X" or "X feature." Therefore, the joint probability p(X, Y), or p(X, X feature), can be approximated by the probability of p(X feature) alone. This alternative implementation may be useful for somewhat trivial (but important) use cases such as rendering contours of a SEM image corresponding to a given CAD image or other design information. In such cases, learning the joint probability of regenerated design information and simulated images is not necessarily needed. Therefore, the joint training described herein can be simplified, as shown in FIG. 6.

Figure 6:
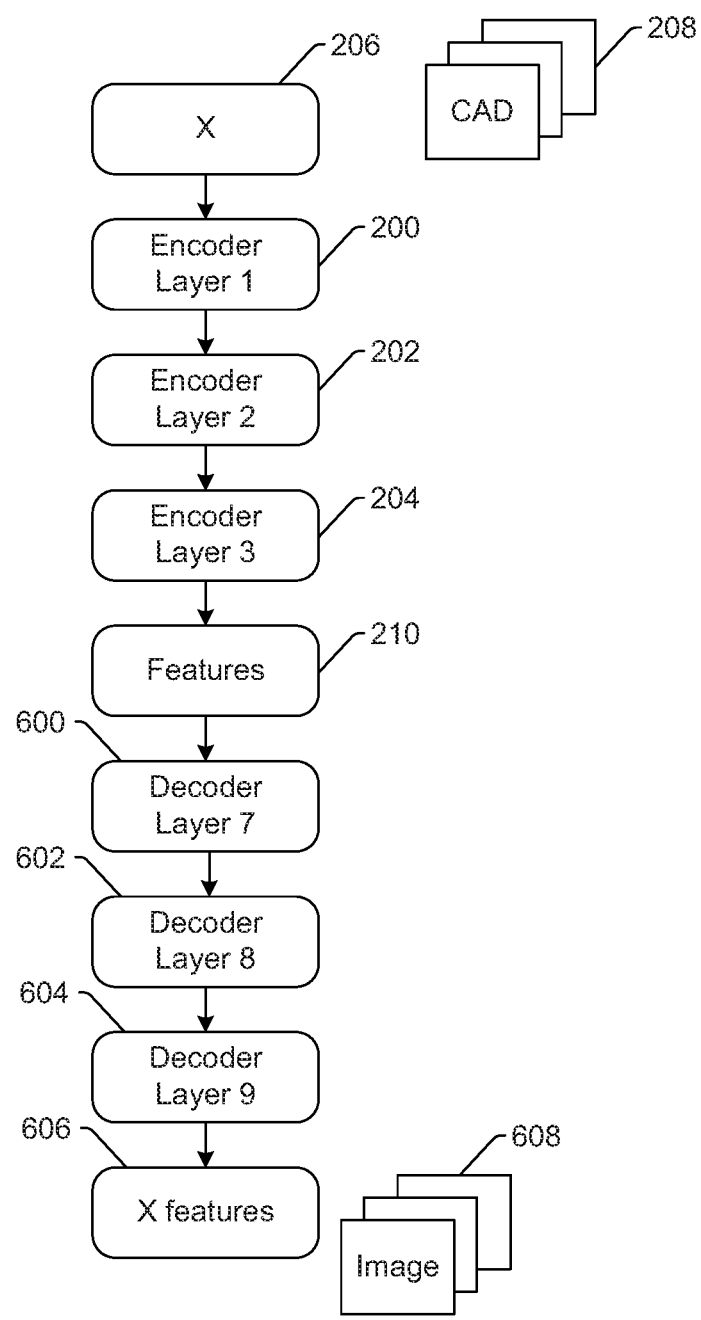

In particular, as shown in FIG. 6, the encoder side of the generative model may be configured as described herein. However, the decoder side of the generative model shown in FIG. 6 may be different from other embodiments of the generative model described herein. For example, as shown in FIG. 6, the decoder portion of the generative model includes decoder layers 600, 602, and 604 (decoder layers 7-9). These decoder layers generate output that is different from the output generated by all of the other embodiments of the generative model described herein. In particular, as shown in FIG. 6, the decoder layers generate X features, 606, that in this embodiment include simulated images 608. In particular, as described further above, if the simulated images can be estimated as features of the design information, then the decoder layers can output X features or "features of X" that are relatively good estimations of the actual images that would be generated by an imaging system or subsystem for the design information formed on the specimen.

In one embodiment, the imaging system is configured to acquire the one or more actual images and the one or more simulated images and to detect defects on the specimen by comparing the one or more actual images to the one or more simulated images. For example, the embodiments described herein can be used to generate a "golden" or "standard" reference to improve die-to-database defect detection algorithms for mask and wafer inspection and metrology. In particular, the actual image(s) may be compared to the simulated image(s) thereby generating difference image(s). A threshold or a defect detection algorithm and/or method may be applied to the difference image(s) to determine which portions of the difference image(s) correspond to defects or potential defects.

In this manner, a "golden" or "standard" reference, i.e., the simulated image(s), may be generated from the design information for the specimen. Having the capability to generate and use such a "golden" or "standard" reference may be particularly important in instances in which the processes used to form the design information on the specimen cannot be predicted at all or very well using a forward or discriminative model. In addition, generating such a "golden" or "standard" reference may be particularly important when a "golden" or "standard" reference cannot be generated from the specimen itself (e.g., due to lack of knowledge about a suitably formed instance of the design information on the specimen and/or if only one instance of the design information is formed on the specimen, e.g., as in a single-die reticle).

In another embodiment, the imaging system is configured to perform calibration of the imaging system using the one or more simulated images. For example, the embodiments described herein can be used to generate a "golden" or "standard" reference for software calibration. In one such example, the simulated image(s) may be compared to actual image(s) generated by the imaging system. Any differences between the simulated image(s) and the actual image(s) may be used to determine if the imaging system is performing as expected. One or more parameters of the imaging system may then be modified based on the differences between the simulated image(s) and the actual image(s) until there are no (or effectively no, e.g., minimal or negligible) differences between the simulated images(s) and the actual image(s). At that point, the imaging system will be calibrated properly.

In a further embodiment, the imaging system is configured to perform alignment of the one or more actual images to the one or more simulated images. For example, the embodiments described herein can be used to generate a "golden" or "standard" reference for hardware and/or software alignment. For example, the simulated image(s) generated as described herein can be aligned to the actual image(s) generated by the imaging system. Once the simulated image(s) have been aligned to the actual image(s), the actual image(s) will be effectively aligned to the design information for the specimen. In this manner, the simulated image(s) described herein may be used for alignment of design to inspection system output. Such alignment may be useful for a number of purposes such as those described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. The embodiments described herein may be further configured as described in these patents. The simulated image(s) generated as described herein may also be aligned to the actual image(s) generated by the imaging system to achieve a particular alignment of the specimen with respect to the imaging system. For example, based on information about the layout of the design information formed on the specimen as well as the alignment of the simulated image(s) to the actual image(s), the position of the specimen with respect to the imaging system can be determined (and corrected if necessary) with relatively high accuracy.

As will be evident to one of ordinary skill in the art based on the description of the embodiments provided herein, the embodiments described herein have a number of significant advantages over other methods and systems for generating simulated images. For example, unlike currently used methods and systems, the embodiments described herein do not use or include any explicit model. In particular, unlike forward simulation and rule-based approaches, there is no requirement on a predefined (physical or heuristic) model, which is typically extremely difficult to determine from first principle physics or to approximate well. Instead, the embodiments described herein eliminate this requirement by learning an implicit model via a deep neural network.

In another example, the embodiments described herein may be configured for relatively diverse learning compared to currently used methods and systems. In one such example, the embodiments described herein are capable of learning a complex and diverse implicit model that regenerates major post-lithography effects (e.g., after an etch or CMP process) shown in a real image.

In an additional example, the embodiments described herein are capable of realistic rendering from statistics. In one such example, the learned implicit model described further herein can represent the statistics of the training dataset and is capable of generating/predicting important statistics (e.g., mean and standard deviation of grey level).

In a further example, the embodiments described herein have relatively fast runtime compared to currently used methods and systems. In particular, the embodiments described herein can have substantially fast speed that enables the simulated images to be generated in a time that is suitable for production runtime (e.g., they can do a relatively quick prediction).

In yet another example, the embodiments described herein can be configured for synthetic defect simulation. For example, as described further herein, synthetic defects can be injected into (i.e., created in) the training dataset for SEM and optical imaging systems by modifying the CAD to inject defects (e.g., protrusions) and then rendering it using the network and adding it as a training example.

The embodiments described herein can also be modified in a number of ways. For example, alternatives to the generative model described herein can be constructed via (1) generative adversarial nets (GAN) with pyramid up-sampling; (2) convolutional neural network (CNN) with densification (i.e., stride=1); (3) recurrent neural network (RNN) with variational auto-encoder (VAE); or (4) Deep Boltzmann Machine with convolutional and deconvolutional layers. Such alternatives can be implemented using any suitable architecture known in the art.

Furthermore, although the embodiments described herein are described as being configured for generating simulated images from design information, the embodiments may be configured to perform the opposite transformations. For example, the generative models described herein may be configured such that X is real images generated by an imaging system or subsystem and Y is the design information (e.g., CAD images). In this manner, a generative model that is trained as described herein can be configured such that the two or more encoder layers determine features of real images generated for a specimen by an imaging system or subsystem and the two or more decoder layers generate simulated design information from the determined features. The simulated design information illustrates how the design information appears in images generated from the design information (e.g., CAD images). In such embodiments, the two or more decoder layers may also be configured to regenerate the actual or real images. In this manner, the embodiments described herein may be configured such that the inputs and outputs are reversed. Such embodiments may be further configured as described herein. Such embodiments may be particularly useful when the design information is not readily available but is needed for some purpose including those described herein (e.g., inspection, calibration, alignment, etc.)

Another embodiment of a system configured to generate simulated images from design information includes one or more computer subsystems, e.g., computer subsystem(s) 102, which may be configured as described further herein, and one or more components, e.g., component(s) 100, executed by the one or more computer subsystems, which may include any of the component(s) described herein. The component(s) include a generative model, e.g., the generative model shown in FIG. 2, 5, or 6, which may be configured as described herein. For example, the generative model includes two or more encoder layers, e.g., layers 200, 202, and 204 shown in FIG. 2, configured for determining features, e.g., features 210, of design information, e.g., CAD images 208, for a specimen and two or more decoder layers, e.g., decoder layers 212, 214, 216, 218, 220, and 222, configured for generating one or more simulated images, e.g., simulated images 226, from the determined features. The simulated image(s) illustrate how the design information formed on the specimen appears in one or more actual images of the specimen. The system also includes an imaging subsystem, e.g., imaging subsystem 10 shown in FIG. 1, configured to generate the one or more actual images of the specimen. The one or more computer subsystems are configured to acquire the one or more actual images and the one or more simulated images and to perform one or more functions for the specimen based on the one or more actual images and the one or more simulated images (i.e., based on a combination of the actual image(s) and the simulated image(s)).

Each of the embodiments of each of the systems described above may be combined together into one single embodiment.

Another embodiment relates to a computer-implemented method for generating simulated images from design information. The method includes determining features, e.g., features 210 shown in FIG. 2, of design information, e.g., CAD images 208, for a specimen by inputting the design information to two or more encoder layers, e.g., encoder layers 200, 202, and 204, of a generative model such as that shown in FIG. 2, 5, or 6. The method also includes generating one or more simulated images, e.g., simulated images 226 shown in FIG. 2, by inputting the determined features to two or more decoder layers, e.g., decoder layers 212, 214, 216, 218, 220, and 222, of the generative model. The one or more simulated images illustrate how the design information formed on the specimen appears in one or more actual images of the specimen generated by an imaging system.

Each of the steps of the method may be performed as described further herein. The method may also include any other step(s) that can be performed by the system, computer subsystem(s), and/or imaging systems or subsystems described herein. The determining and generating steps are performed by one or more computer systems, which may be configured according to any of the embodiments described herein, e.g., computer subsystem(s) 102. In addition, the method described above may be performed by any of the system embodiments described herein.

Figure 7:
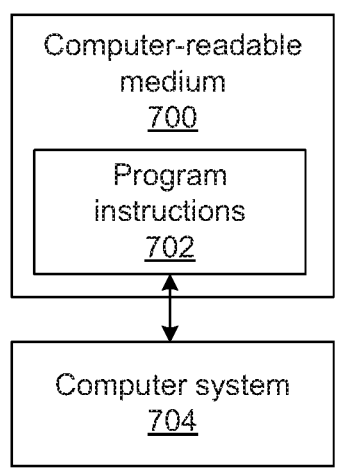
FIG. 7 is a block diagram illustrating one embodiment of a non-transitory computer-readable medium storing program instructions for causing a computer system to perform a computer-implemented method described herein.

An additional embodiment relates to a non-transitory computer-readable medium storing program instructions executable on a computer system for performing a computer-implemented method for generating simulated images from design information. One such embodiment is shown in FIG. 7. In particular, as shown in FIG. 7, non-transitory computer-readable medium 700 includes program instructions 702 executable on computer system 704. The computer-implemented method may include any step(s) of any method(s) described herein.

Program instructions 702 implementing methods such as those described herein may be stored on computer-readable medium 700. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 704 may be configured according to any of the embodiments described herein.

Further modifications and alternative embodiments of various aspects of the invention will be apparent to those skilled in the art in view of this description. For example, methods and systems for generating simulated images from design information are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to generate simulated images from design information, comprising:
   one or more computer subsystems; and
   one or more components executed by the one or more computer subsystems, wherein the one or more components comprise:
      a generative model, wherein the generative model comprises:
         two or more encoder layers configured for determining features of design information for a specimen; and
         two or more decoder layers configured for generating one or more simulated images from the determined features, wherein the one or more simulated images illustrate how the design information formed on the specimen appears in one or more actual images of the specimen generated by an imaging system.

2. The system of claim 1, wherein the generative model is a deep generative model.

3. The system of claim 1, wherein the generative model is a convolution and deconvolution neural network.

4. The system of claim 1, wherein the two or more encoder layers comprise two or more convolutional and pooling layers, and wherein the two or more decoder layers comprise two or more deconvolutional and up-pooling layers.

5. The system of claim 1, wherein the two or more encoder layers determine the features by dimension reduction of the design information.

6. The system of claim 1, wherein the design information is computer aided design data.

7. The system of claim 1, wherein the one or more computer subsystems are configured for generating a training dataset used for training the generative model, and wherein the training dataset comprises a set of pairs of a portion of other design information and an actual image generated for the portion of the other design information.

8. The system of claim 1, wherein the one or more computer subsystems are configured for modifying a portion of other design information to create a predetermined defect in the portion of the other design information and generating a training dataset used for training the generative model, and wherein the training dataset comprises: a pair of the modified portion of the other design information and an actual image generated for the modified portion of the other design information; and other pairs of a portion of the other design information and an actual image generated for the portion of the other design information.

9. The system of claim 1, wherein the one or more computer subsystems are configured for pre-training the two or more encoder layers and a portion of the two or more decoder layers.

10. The system of claim 1, wherein the one or more computer subsystems are configured for training the two or more encoder layers and a portion of the two or more decoder layers by learning the features for design information in a training dataset, and wherein the learning comprises inferring the features for the design information in the training dataset using the two or more encoder layers and regenerating the design information in the training dataset from the inferred features using the portion of the two or more decoder layers.

11. The system of claim 10, wherein the training is unsupervised.

12. The system of claim 10, wherein the one or more components further comprise an additional component, wherein the training is performed using the additional component, and wherein the additional component comprises an auto-encoder, a stacked auto-encoder, an auto-encoder with regularization, a denoising auto-encoder, stacked denoising auto-encoders, a sparse auto-encoder, a variational auto-encoder, an auto-encoder configured to learn a distribution of features, a Restricted Boltzmann Machine, a Restricted Boltzmann Machine configured to learn a distribution of features, a gated Markov Random Field, a Deep Boltzmann Machine, a Deep Belief Network, a convolutional Restricted Boltzmann Machine, a convolution auto-encoder, a convolutional neural network, a recurrent neural network, a long short-term memory, generative adversarial nets, or some combination thereof.

13. The system of claim 10, wherein the learned features comprise vectors of scalar values, vectors of independent distributions, or joint distributions.

14. The system of claim 10, wherein the learned features comprise vectors of independent distributions, and wherein the vectors of independent distributions comprise Bernoulli, binomial, multinomial, Poisson binomial, beta-binomial, multinomial, Boltzmann, Poisson, Conway-Maxwell-Poisson, Beta, Gaussian/Normal, Skew normal, Rayleigh, Laplace, gamma, pareto, or student-t distributions.

15. The system of claim 10, wherein the learned features comprise joint distributions, and wherein the joint distributions comprise Multivariate Gaussian/Normal, multivariate student-t, Dirichlet, matrix Gaussian/normal, or matrix t-distributions.

16. The system of claim 1, wherein the one or more computer subsystems are configured for pre-training the two or more encoder layers and a portion of the two or more decoder layers and, subsequent to the pre-training, training the two or more encoder layers, the portion of the two or more decoder layers, and another portion of the two or more decoder layers.

17. The system of claim 1, wherein the one or more computer subsystems are configured for training the two or more encoder layers and the two or more decoder layers by learning the features for design information in a training dataset, and wherein the learning comprises inferring the features for the design information in the training dataset using the two or more encoder layers, regenerating the design information in the training dataset from the inferred features using the two or more decoder layers, generating simulated images for the design information in the training dataset from the inferred features using the two or more decoder layers, and modifying one or more parameters of the two or more decoder layers until the simulated images for the design information in the training dataset match actual images for the design information in the training dataset.

18. The system of claim 17, wherein the training is supervised.

19. The system of claim 17, wherein the one or more parameters comprise weights.

20. The system of claim 1, wherein the two or more encoder layers are fixed.

21. The system of claim 1, wherein the two or more encoder layers are trainable.

22. The system of claim 1, wherein the two or more decoder layers comprise first and second portions of the two or more decoder layers, and wherein the first and second portions are jointly constructed.

23. The system of claim 1, wherein the two or more decoder layers comprise first and second portions of the two or more decoder layers, and wherein the one or more computer subsystems are configured to jointly train the first and second portions.

24. The system of claim 1, wherein the two or more decoder layers comprise a first portion of the two or more decoder layers configured in a first pass and a second portion of the two or more decoder layers configured in a second pass.

25. The system of claim 1, wherein the two or more decoder layers comprise first and second portions of the two or more decoder layers configured as a single pass via channel configuration.

26. The system of claim 1, wherein the two or more decoder layers are further configured for regenerating the design information from the determined features.

27. The system of claim 1, wherein the one or more actual images are generated for the specimen by the imaging system after a process is performed on the specimen, and wherein the process comprises a final fabrication process step that is not a lithography process.

28. The system of claim 1, wherein at least one of the one or more simulated images illustrates one or more statistics for the one or more simulated images.

29. The system of claim 28, wherein the one or more statistics comprise one or more distributions selected from a group consisting of Bernoulli, binomial, multinomial, Poisson binomial, beta-binomial, beta-multinomial, Boltzmann, Poisson, Conway-Maxwell-Poisson, Beta, Gaussian/Normal, Skew normal, Rayleigh, Laplace, gamma, pareto, student-t, Multivariate Gaussian/Normal, multivariate student-t, Dirichlet, matrix Gaussian/Normal, and matrix t-distribution.

30. The system of claim 1, wherein generating the one or more simulated images comprises directly deriving the one or more simulated images from the determined features.

31. The system of claim 1, wherein the imaging system is an electron beam based imaging system.

32. The system of claim 1, wherein the imaging system is an optical based imaging system.

33. The system of claim 1, wherein the imaging system is an inspection system.

34. The system of claim 1, wherein the imaging system is a defect review system.

35. The system of claim 1, wherein the imaging system is a metrology system.

36. The system of claim 1, wherein the specimen is a wafer.

37. The system of claim 1, wherein the specimen is a reticle.

38. The system of claim 1, wherein the imaging system is configured to acquire the one or more actual images and the one or more simulated images and to detect defects on the specimen by comparing the one or more actual images to the one or more simulated images.

39. The system of claim 1, wherein the imaging system is configured to perform calibration of the imaging system using the one or more simulated images.

40. The system of claim 1, wherein the imaging system is configured to perform alignment of the one or more actual images to the one or more simulated images.

41. A system configured to generate simulated images from design information, comprising:
 one or more computer subsystems;
 one or more components executed by the one or more computer subsystems, wherein the one or more components comprise:

a generative model, wherein the generative model comprises:
> two or more encoder layers configured for determining features of design information for a specimen; and
>
> two or more decoder layers configured for generating one or more simulated images from the determined features, wherein the one or more simulated images illustrate how the design information formed on the specimen appears in one or more actual images of the specimen; and an imaging subsystem configured to generate the one or more actual images of the specimen, wherein the one or more computer subsystems are configured to acquire the one or more actual images and the one or more simulated images and to perform one or more functions for the specimen based on the one or more actual images and the one or more simulated images.

42. A non-transitory computer-readable medium, storing program instructions executable on a computer system for performing a computer-implemented method for generating simulated images from design information, wherein the computer-implemented method comprises:

> determining features of design information for a specimen by inputting the design information to two or more encoder layers of a generative model; and
>
> generating one or more simulated images by inputting the determined features to two or more decoder layers of the generative model, wherein the one or more simulated images illustrate how the design information formed on the specimen appears in one or more actual images of the specimen generated by an imaging system.

43. A computer-implemented method for generating simulated images from design information, comprising:

> determining features of design information for a specimen by inputting the design information to two or more encoder layers of a generative model; and
>
> generating one or more simulated images by inputting the determined features to two or more decoder layers of the generative model, wherein the one or more simulated images illustrate how the design information formed on the specimen appears in one or more actual images of the specimen generated by an imaging system, and wherein said determining and said generating are performed with one or more computer systems.

* * * * *